US012695381B2

(12) United States Patent
Aramata et al.

(10) Patent No.: US 12,695,381 B2
(45) Date of Patent: Jul. 28, 2026

(54) TRACKER MODULE

(71) Applicant: Murata Manufacturing Co., Ltd., Nagaokakyo (JP)

(72) Inventors: Tomohide Aramata, Nagaokakyo (JP); Takeshi Kogure, Nagaokakyo (JP); Toshiki Matsui, Nagaokakyo (JP); Yuuki Fukuda, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 183 days.

(21) Appl. No.: 18/611,882

(22) Filed: Mar. 21, 2024

(65) Prior Publication Data

US 2024/0235390 A1      Jul. 11, 2024

Related U.S. Application Data

(63) Continuation of application No. PCT/JP2022/035980, filed on Sep. 27, 2022.

(30) Foreign Application Priority Data

Sep. 29, 2021      (JP) ................................. 2021-159747

(51) Int. Cl.
H02M 3/07 (2006.01)
H03F 1/02 (2006.01)
(Continued)

(52) U.S. Cl.
CPC ............ H02M 3/07 (2013.01); H03F 1/0227 (2013.01); H03F 3/195 (2013.01); H03F 3/245 (2013.01);
(Continued)

(58) Field of Classification Search
CPC .......... H02M 3/07; H01L 23/66; H01L 25/16; H01L 2223/665; H01L 2223/6655;
(Continued)

(56) References Cited

U.S. PATENT DOCUMENTS 6,707,682 B2 *    3/2004    Akiba .................. H05K 1/0246
                                                            361/764
6,815,810 B2 *    11/2004    Takehara ............... H05K 1/186
                                                            257/E23.125
(Continued)

FOREIGN PATENT DOCUMENTS

JP        2011-176529 A      9/2011
JP        2015-533066 A      11/2015
JP        2016-149751 A      8/2016

OTHER PUBLICATIONS

International Search Report received for PCT Patent Application No. PCT/JP2022/035980, mailed on Dec. 13, 2022, 2 pages.

*Primary Examiner* — Michael J Jansen, II
(74) *Attorney, Agent, or Firm* — ArentFox Schiff LLP

(57) ABSTRACT

A tracker module includes a module laminate and an integrated circuit, a filter circuit and an output terminal arranged in or on the module laminate. The integrated circuit includes at least one switch of a switched-capacitor circuit, and at least one switch of a supply modulator. The switched-capacitor circuit is configured to generate a plurality of discrete voltages. The supply modulator is configured to generate an intermediate output by selectively switching among the plurality of discrete voltages based on an envelope signal to vary the intermediate output with the envelope signal. The envelope signal is associated with a signal to be processed by an external circuit that is out of the tracker module. The filter circuit filters the intermediate output to generate a filtered output, and the output terminal provides the filtered output to the external circuit to power the external circuit.

20 Claims, 6 Drawing Sheets

(51) Int. Cl.

| | | |
|---|---|---|
| *H03F 3/195* | (2006.01) | |
| *H03F 3/24* | (2006.01) | |
| *H10W 44/20* | (2026.01) | |
| *H10W 90/00* | (2026.01) | |

(52) U.S. Cl.

CPC ............... *H10W 44/20* (2026.01); *H03F 1/02* (2013.01); *H03F 3/24* (2013.01); *H03F 2200/451* (2013.01); *H10W 44/231* (2026.01); *H10W 44/234* (2026.01); *H10W 90/00* (2026.01)

(58) Field of Classification Search

CPC ........ H03F 1/02; H03F 3/24; H03F 2200/451; H03F 1/0227; H03F 3/195; H03F 3/245; H10W 44/20; H10W 44/231; H10W 44/234; H10W 90/00

See application file for complete search history.

(56) References Cited

U.S. PATENT DOCUMENTS

| | | | | |
|---|---|---|---|---|
| 8,824,978 | B2* | 9/2014 | Briffa ...................... | H03F 3/195 |
| | | | | 455/127.1 |
| 9,083,290 | B2* | 7/2015 | Kurokawa ............. | H01R 24/50 |
| 9,755,672 | B2* | 9/2017 | Perreault ............... | H02M 3/158 |
| 9,893,684 | B2* | 2/2018 | Lehtola ................. | H03F 1/0266 |
| 10,277,174 | B2* | 4/2019 | Lehtola ................. | H03F 1/0266 |
| 10,784,823 | B2* | 9/2020 | Lehtola .................... | H03F 3/68 |
| 12,206,439 | B2* | 1/2025 | Kogure ................... | H04B 1/04 |
| 12,335,203 | B2* | 6/2025 | Tomita ...................... | H04L 5/14 |
| 12,431,785 | B2* | 9/2025 | Kogure .............. | H02M 1/0048 |
| 2002/0015293 | A1* | 2/2002 | Akiba ................. | H01L 23/5383 |
| | | | | 257/E23.114 |
| 2003/0071350 | A1* | 4/2003 | Takehara ............ | H01L 23/5389 |
| | | | | 257/E23.125 |
| 2012/0294201 | A1* | 11/2012 | Kurokawa ................ | H03F 1/32 |
| | | | | 330/68 |
| 2014/0118063 | A1* | 5/2014 | Briffa .................... | H03F 1/0288 |
| | | | | 330/127 |
| 2015/0155895 | A1* | 6/2015 | Perreault ................. | H02M 3/07 |
| | | | | 330/297 |
| 2016/0241208 | A1* | 8/2016 | Lehtola ................ | H03F 1/0266 |
| 2018/0241360 | A1* | 8/2018 | Lehtola ................ | H03F 1/0266 |
| 2019/0326864 | A1* | 10/2019 | Lehtola .................... | H03F 3/68 |
| 2022/0385314 | A1* | 12/2022 | Kogure .................. | H03F 3/245 |
| 2023/0072796 | A1* | 3/2023 | Kogure .................. | H03F 3/245 |
| 2023/0076829 | A1* | 3/2023 | Tomita ................. | H03F 1/0211 |
| 2023/0402979 | A1* | 12/2023 | Kogure .................. | H04B 1/04 |
| 2024/0235364 | A1* | 7/2024 | Kogure .................. | H02M 3/07 |
| 2024/0235390 | A1* | 7/2024 | Aramata ................ | H01L 23/66 |
| 2024/0235481 | A1* | 7/2024 | Aramata ............. | H03F 1/0211 |
| 2024/0235484 | A1* | 7/2024 | Kogure .................. | H02M 3/07 |
| 2024/0235485 | A1* | 7/2024 | Kogure ................ | H03F 1/0233 |
| 2024/0235486 | A1* | 7/2024 | Kogure ................ | H03F 1/0222 |
| 2024/0235487 | A1* | 7/2024 | Fukasawa ............ | H03F 1/0233 |
| 2024/0235585 | A1* | 7/2024 | Kogure .................. | H03F 3/195 |
| 2024/0243697 | A1* | 7/2024 | Uejima .................. | H03F 3/195 |
| 2024/0258973 | A1* | 8/2024 | Kogure ................ | H03F 1/0227 |
| 2024/0267003 | A1* | 8/2024 | Aramata .................. | H03F 1/02 |
| 2024/0313714 | A1* | 9/2024 | Banno .................... | H01L 25/16 |
| 2024/0313744 | A1* | 9/2024 | Yamaguchi .......... | H03H 7/0115 |
| 2024/0333150 | A1* | 10/2024 | Hoversten ................ | H03F 1/02 |
| 2024/0333220 | A1* | 10/2024 | Hoversten .............. | H03F 3/245 |
| 2024/0333223 | A1* | 10/2024 | Oomori .................. | H03F 3/245 |
| 2025/0070720 | A1* | 2/2025 | Hoversten .............. | H03F 3/005 |
| 2025/0070721 | A1* | 2/2025 | Hoversten .............. | H03F 3/245 |
| 2025/0070761 | A1* | 2/2025 | Kando ..................... | H04B 1/38 |
| 2025/0080075 | A1* | 3/2025 | Kando .................. | H03H 9/568 |
| 2025/0202430 | A1* | 6/2025 | Kogure .................. | H03F 3/195 |
| 2025/0202432 | A1* | 6/2025 | Kogure .................... | H03F 1/02 |
| 2025/0202512 | A1* | 6/2025 | Kogure ..................... | H03F 1/02 |
| 2025/0260367 | A1* | 8/2025 | Hoversten ............ | H02M 3/158 |
| 2025/0279750 | A1* | 9/2025 | Tomita .................. | H03F 3/195 |
| 2025/0279751 | A1* | 9/2025 | Tomita .................... | H04B 1/04 |
| 2025/0279752 | A1* | 9/2025 | Tomita .................. | H03F 3/195 |
| 2025/0286511 | A1* | 9/2025 | Hoversten .............. | H03F 3/245 |
| 2025/0286512 | A1* | 9/2025 | Hoversten .............. | H03F 3/245 |
| 2025/0343513 | A1* | 11/2025 | Arai .................... | H03F 1/0233 |
| 2025/0350311 | A1* | 11/2025 | Arai ...................... | H04B 1/401 |
| 2025/0392337 | A1* | 12/2025 | Okamoto ............ | H04B 1/3827 |

* cited by examiner

TRACKER MODULE

CROSS REFERENCE TO RELATED APPLICATIONS

This application is a continuation of International Application No. PCT/JP2022/035980, filed Sep. 27, 2022, which claims priority to Japanese Patent Application No. 2021-159747, filed Sep. 29, 2021, the entire contents of each of which are hereby incorporated by reference in their entirety.

TECHNICAL FIELD

The present disclosure relates to a tracker module.

BACKGROUND

A related exemplary circuit, such as described in U.S. Pat. No. 9,755,672 (hereinafter "Patent Document 1") discloses a power modulation circuit capable of supplying a power amplifier with a power supply voltage that is dynamically adjusted over time in accordance with a radio frequency signal.

A power supply voltage signal generated by the power modulation circuit of Patent Document 1 is a rectangular wave and thus includes a lot of radio frequency noise. Thus, in a case where the power modulation circuit (a power supply circuit) is modularized into a module (e.g., a power supply module), noise generated in the module may have a significant effect on elements outside the module.

SUMMARY OF THE INVENTION

According to some exemplary aspects, the present disclosure provides a tracker module (also referred to as a power supply module in some examples) that reduces the effect of noise generated in the tracker module on elements outside the tracker module.

According to some exemplary aspects, a tracker module is provided that includes a module laminate configured to provide interconnections to circuit components arranged in or on the module laminate. The tracker module also includes at least one integrated circuit arranged in or on the module laminate, a first filter circuit arranged in or on the module laminate and a first output terminal arranged in or on the module laminate. The first filter circuit is configured to filter a first intermediate output and generate a first filtered output. The first output terminal is electrically coupled to the first filter circuit and is configured to provide the first filtered output from the first filter circuit to a first external circuit that is outside of the tracker module, the first filtered output provides power to the first external circuit. The at least one integrated circuit includes at least one switch that is a portion of a switched-capacitor circuit. The switched-capacitor circuit is configured to generate a plurality of discrete voltages. The at least one integrated circuit also includes at least one switch that is a portion of a supply modulator, the supply modulator is configured to generate the first intermediate output by selectively switching among the plurality of discrete voltages based on a first envelope signal to vary the first intermediate output with the first envelope signal. The first envelop signal is associated with a first signal to be processed by the first external circuit.

A tracker module according to an aspect of the present disclosure includes a module laminate, at least one integrated circuit arranged in or on the module laminate, a first filter circuit arranged in or on the module laminate, and a first output terminal electrically connected to the first filter circuit. The at least one integrated circuit includes at least one switch included in a switched-capacitor circuit configured to generate, based on an input voltage, a plurality of discrete voltages, and at least one switch included in a supply modulator configured to output, to the first filter circuit, at least one out of the plurality of discrete voltages in a selective manner based on a first envelope signal.

A tracker module according to an aspect of the present disclosure includes a module laminate, at least one integrated circuit arranged in or on the module laminate, a first filter circuit arranged in or on the module laminate, and a first output terminal electrically connected to the first filter circuit. The at least one integrated circuit includes at least one switch included in a switched-capacitor circuit, and at least one switch included in a supply modulator. The switched-capacitor circuit includes a first capacitor and a second capacitor, the first capacitor having a first electrode and a second electrode, the second capacitor having a third electrode and a fourth electrode. The at least one switch included in the switched-capacitor circuit includes a first switch, a second switch, a third switch, a fourth switch, a fifth switch, a sixth switch, a seventh switch, and an eighth switch. One end of the first switch and one end of the third switch are connected to the first electrode. One end of the second switch and one end of the fourth switch are connected to the second electrode. One end of the fifth switch and one end of the seventh switch are connected to the third electrode. One end of the sixth switch and one end of the eighth switch are connected to the fourth electrode. Another end of the first switch, another end of the second switch, another end of the fifth switch, and another end of the sixth switch are connected to each other. Another end of the third switch is connected to another end of the seventh switch. Another end of the fourth switch is connected to another end of the eighth switch. The at least one switch included in the supply modulator includes a ninth switch connected between the other ends of the first, second, fifth, and sixth switches and the first filter circuit, and a tenth switch connected between the other ends of the third and seventh switches and the first filter circuit.

According to a tracker module according to an aspect of the present disclosure, the effect of noise generated in the module on elements outside the module can be reduced.

DETAILED DESCRIPTION OF EXEMPLARY EMBODIMENTS

Figure 1:
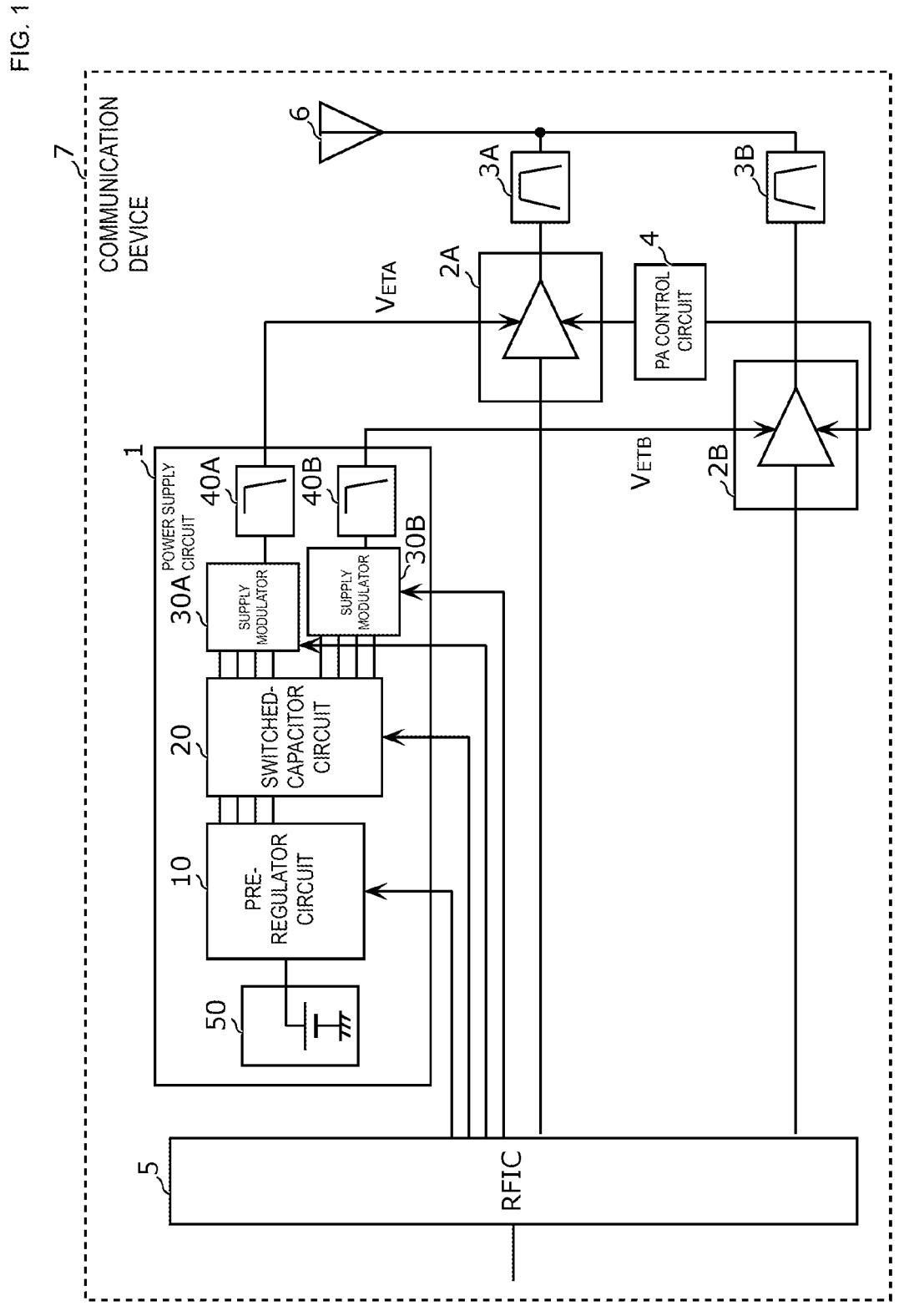
FIG. 1 is a circuit configuration diagram of a communication device according to an exemplary embodiment.

In the following, exemplary embodiments according to the present disclosure will be described in detail using the drawings. Note that the exemplary embodiments described below are intended to represent both comprehensive and specific examples. Numerical values, shapes, materials, constituent elements, arrangement and connection forms of the constituent elements, and so forth described in the following embodiments are examples and are not intended to limit the present disclosure.

Note that each drawing is a schematic diagram in which emphasis, omissions, or ratios are adjusted as necessary to illustrate the present disclosure. The drawings are not necessarily strict illustrations and may differ from the actual shape, positional relationship, and ratios. In each drawing, substantially identical configurations are denoted by the same signs, and redundant description may be omitted or simplified.

In the following each diagram, the x-axis and the y-axis are axes orthogonal to each other on a plane parallel to a main surface of a module laminate. Specifically, in a case where the module laminate is rectangular in a plan view, the x-axis is parallel to a first edge of the module laminate, and the y-axis is parallel to a second edge of the module laminate orthogonal to the first edge. Moreover, the z-axis is an axis perpendicular to the main surface of the module laminate, and its positive direction indicates the upward direction and its negative direction indicates the downward direction.

In circuit configurations of the present disclosure, the term "connected" includes not only cases where a direct connection is established by a connection terminal, a wiring conductor, or a connection terminal and a wiring conductor but also cases where an electrical connection is established using other circuit elements. Moreover, the expression "connected between A and B" refers to being connected to both A and B between A and B, and includes, in addition to cases of being connected in series along a path connecting A and B, cases of being connected in parallel (e.g., shunt-connected) between the path and ground.

In the arrangement of components of the present disclosure, the expression "a component is arranged in or on a laminate" includes the component being arranged on a main surface of the laminate and the component being arranged in the laminate. Moreover, the expression "a component is arranged on a main surface of the laminate" includes the component being arranged in contact with the main surface of the laminate, and also includes the component being arranged above the main surface without being in contact with the main surface (for example, the component being stacked on another component arranged in contact with the main surface). Moreover, the expression "a component is arranged on a main surface of the laminate" may include the component being arranged in a recess formed in the main surface. The expression "a component is arranged in the laminate" includes the component being encapsulated within the module laminate. Moreover, the expression "a component is arranged in the laminate" also includes the entire component being arranged between both main surfaces of the laminate but having part left uncovered by the laminate and includes only part of the component being arranged in the laminate.

In the arrangement of components of the present disclosure, the expression "a module laminate is viewed in a plan view" refers to viewing an object from the positive side of the z-axis in an orthographic projection onto the xy-plane. For purposes of this disclosure, the expression "A overlaps B in a plan view" means that the region of A orthographically projected onto the xy-plane overlaps the region of B orthographically projected onto the xy-plane.

Moreover, in the arrangement of components of the present disclosure, the expression "A is arranged adjacent to B" means that A and B are arranged in close proximity. Specifically, "A is arranged adjacent to B" means that other circuit components are absent in the space facing A and B. In other words, "A is arranged adjacent to B" means that none of a plurality of line segments from any point on the surface of A facing B to B along the direction normal to that surface passes through circuit components other than A and B. In this case, the circuit components refer to components that include active elements, passive elements, or active elements and passive elements. In other words, the circuit components include active components and passive components and do not include electromechanical components. Examples of the active components include transistors and diodes. Examples of the passive components include inductors, transformers, capacitors, and resistors. Examples of the electromechanical components include terminals, connectors, and wiring lines.

It is also noted that terms indicating the relationship between elements, such as "parallel" and "perpendicular", terms indicating the shape of elements such as "rectangular", and numerical ranges are not intended to express strict meanings only but are also intended to include substantially equivalent ranges, such as errors of about a few percent.

EMBODIMENT

In the following, a tracker module and a communication device according to the present embodiment will be described with reference to the drawings.

1 Circuit Configurations of Communication Device 7 and Power Supply Circuit 1

The circuit configuration of a communication device 7 according to the present exemplary embodiment will be described with reference to FIG. 1. FIG. 1 is a circuit configuration diagram of the communication device 7 according to the present exemplary embodiment.

[1.1 Circuit Configuration of Communication Device 7]

First, the circuit configuration of the communication device 7 will be described. As illustrated in FIG. 1, the communication device 7 according to the present embodiment includes a power supply circuit 1, power amplifiers (PAs) 2A and 2B, filters 3A and 3B, a PA control circuit 4, a radio frequency integrated circuit (RFIC) 5, and an antenna 6.

The power supply circuit 1 can supply the power amplifiers 2A and 2B with power supply voltages $V_{ETA}$ and $V_{ETB}$, respectively, in a digital envelope tracking (ET) mode. In the digital ET mode, the voltage level of each of the power supply voltages $V_{ETA}$ and $V_{ETB}$ is selected from among a plurality of discrete voltage levels on the basis of digital control signals corresponding to envelope signals and changes with time.

An envelope signal is a signal that indicates the envelope value of a modulated signal (a radio frequency signal). The envelope value is expressed, for example, as the square root of $(I^2+Q^2)$. In this case, $(I, Q)$ represents a constellation point. A constellation point is a point on the constellation diagram that represents a signal modulated by digital modulation. The digital ET mode will be described later in detail using FIGS. 3A and 3B.

Note that, in FIG. 1, the power supply circuit 1 supplies the two power amplifiers 2A and 2B with the two power supply voltages $V_{ETA}$ and $V_{ETB}$, respectively; however, the power supply circuit 1 may supply the same power supply voltage to a plurality of power amplifiers.

As illustrated in FIG. 1, the power supply circuit 1 includes a pre-regulator circuit 10, a switched-capacitor circuit 20, supply modulators 30A and 30B, filter circuits 40A and 40B, and a direct current (DC) power source 50.

The pre-regulator circuit 10 includes a power inductor and a switch. A power inductor is an inductor that is configured to increase and/or reduce a DC voltage. The power inductor is arranged in series along a signal path. According to some exemplary aspects, the power inductor is connected between a signal path and ground (i.e., arranged in parallel). The pre-regulator circuit 10 can convert the input voltage into a first voltage using the power inductor. The pre-regulator circuit 10 may also be called a magnetic regulator or a DC/DC converter.

Note that the pre-regulator circuit 10 does not have to have a power inductor, and in an exemplary embodiment, is a switched capacitor circuit or the like that increases voltage by switching capacitors arranged along a series arm path and a parallel arm path, in a respective manner, of the pre-regulator circuit 10, for example. Moreover, the pre-regulator circuit 10 may have a transformer.

The switched-capacitor circuit 20 includes a plurality of capacitors and a plurality of switches, and can generate, from the first voltage from the pre-regulator circuit 10, a plurality of second voltages having a plurality of respective discrete voltage levels as a plurality of discrete voltages. The switched-capacitor circuit 20 may also be called a switched-capacitor voltage balancer.

The supply modulators 30A and 30B can select, on the basis of digital control signals corresponding to envelope signals, at least one from among the plurality of second voltages generated by the switched-capacitor circuit 20 and output the selected second voltage(s) to the filter circuits 40A and 40B, respectively.

The filter circuits 40A and 40B are an example of a first filter circuit and a second filter circuit and can filter the signals (the second voltages) from the supply modulators 30A and 30B.

The DC power source 50 can supply the pre-regulator circuit 10 with a DC voltage. As the DC power source 50, for example, a rechargeable battery can be used; however, the DC power source 50 is not limited to this.

Note that the power supply circuit 1 does not have to include at least one out of the pre-regulator circuit 10, the switched-capacitor circuit 20, the supply modulators 30A and 30B, the filter circuits 40A and 40B, and the DC power source 50. For example, the power supply circuit 1 does not have to include the pre-regulator circuit 10, the supply modulator 30B, the filter circuit 40B, or the DC power source 50. Moreover, any combination from among the pre-regulator circuit 10, the switched-capacitor circuit 20, the supply modulators 30A and 30B, and the filter circuits 40A and 40B is integrated into a single circuit according to an exemplary aspect.

The power amplifier 2A is connected between the RFIC 5 and the filter 3A. Furthermore, the power amplifier 2A can receive the power supply voltage $V_{ETA}$ from the power supply circuit 1 and can receive a bias signal from the PA control circuit 4. This allows the power amplifier 2A to amplify a transmission signal of a band A received from the RFIC 5.

The power amplifier 2B is connected between the RFIC 5 and the filter 3B. Furthermore, the power amplifier 2B can receive the power supply voltage $V_{ETB}$ from the power supply circuit 1 and can receive a bias signal from the PA control circuit 4. This allows the power amplifier 2B to amplify a transmission signal of a band B received from the RFIC 5.

The filter 3A is connected between the power amplifier 2A and the antenna 6. The filter 3A has a pass band that includes the band A. As a result, the filter 3A allows the transmission signal of the band A amplified by the power amplifier 2A to pass therethrough.

The filter 3B is connected between the power amplifier 2B and the antenna 6. The filter 3B has a pass band that includes the band B. As a result, the filter 3B allows the transmission signal of the band B amplified by the power amplifier 2B to pass therethrough.

The PA control circuit 4 can control the power amplifiers 2A and 2B. Specifically, the PA control circuit 4 can supply each of the power amplifiers 2A and 2B with a bias signal.

The RFIC 5 is an example of a signal processing circuit that processes radio frequency signals. Specifically, the RFIC 5 performs image processing, such as up-conversion, on the input transmission signal, and supplies the power amplifiers 2A and 2B with the radio frequency transmission signal generated through the signal processing. Moreover, the RFIC 5 includes a controller that controls the power supply circuit 1. According to an exemplary aspects, some or all of the functions of the RFIC 5 as a controller are implemented outside the RFIC 5.

The antenna 6 transmits a signal of the band A input from the power amplifier 2A through the filter 3A and a signal of the band B input from the power amplifier 2B through the filter 3B.

The bands A and B are frequency bands for a communication system built using a radio access technology (RAT). The bands A and B are predefined by a standardizing body, examples of which include the 3rd Generation Partnership Project (3GPP®) and Institute of Electrical and Electronics Engineers (IEEE). Examples of the communication system include the 5th Generation New Radio (5G NR) system, the long-term evolution (LTE) system, and a wireless local area network (WLAN) system.

Note that the circuit configuration of the communication device 7 illustrated in FIG. 1 is an example and is not limited to this. For example, the communication device 7 does not have to have the antenna 6. Moreover, for example, the communication device 7 may have a plurality of antennas.

[1.2 Circuit Configuration of Power Supply Circuit 1]

Figure 2:
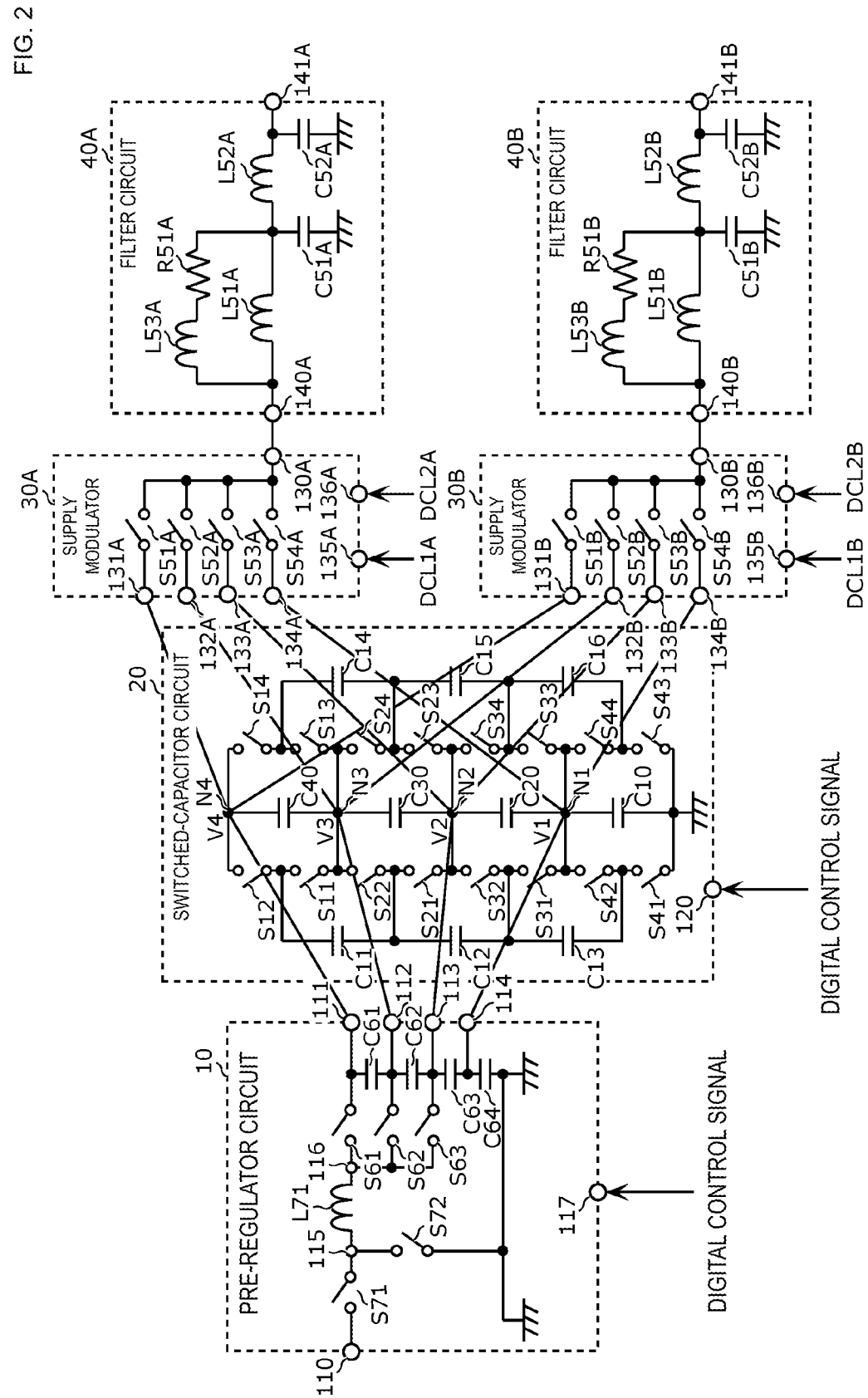
FIG. 2 is a circuit configuration diagram of a pre-regulator circuit, a switched-capacitor circuit, a supply modulator, and a filter circuit according to the exemplary embodiment.

Next, the circuit configurations of the pre-regulator circuit 10, the switched-capacitor circuit 20, the supply modulators 30A and 30B, and the filter circuits 40A and 40B included in the power supply circuit 1 will be described with reference to FIG. 2. FIG. 2 is a circuit configuration diagram of the pre-regulator circuit 10, the switched-capacitor circuit 20, the supply modulators 30A and 30B, and the filter circuits 40A and 40B according to the present embodiment.

Note that FIG. 2 illustrates an exemplary circuit configuration, and the pre-regulator circuit 10, the switched-capacitor circuit 20, the supply modulators 30A and 30B, and the filter circuits 40A and 40B can be implemented using any of a wide variety of circuit implementations and circuit techniques. Thus, description of each circuit provided below is not to be construed in a limited manner.

[1.2.1 Circuit Configuration of Switched-Capacitor Circuit 20]

First, the circuit configuration of the switched-capacitor circuit 20 will be described. As illustrated in FIG. 2, the switched-capacitor circuit 20 includes capacitors C11 to C16, capacitors C10, C20, C30, and C40, switches S11 to S14, S21 to S24, S31 to S34, and S41 to S44, and a control terminal 120. Energy and electric charge are input from the pre-regulator circuit 10 into the switched-capacitor circuit 20 through nodes N1 to N4 and are extracted from the switched-capacitor circuit 20 to the supply modulators 30A and 30B through the nodes N1 to N4.

The control terminal 120 is an input terminal for a digital control signal. That is, the control terminal 120 is a terminal for receiving a digital control signal for controlling the switched-capacitor circuit 20. As the digital control signal received through the control terminal 120, for example, a control signal for a source synchronization method for transmitting a data signal and a clock signal can be used; however, the digital control signal is not limited to this. For example, as the digital control signal, a control signal for a clock embedding method in which a clock is embedded in a data signal is used according to an exemplary aspect.

Each of the capacitors C11 to C16 functions as a flying capacitor, which may also be called a transfer capacitor. That is, each of the capacitors C11 to C16 is configured to increase or reduce the first voltage supplied from the pre-regulator circuit 10. More specifically, the capacitors C11 to C16 allow electric charge to move between the capacitors C11 to C16 and the nodes N1 to N4 such that voltages V1 to V4 (voltages relative to a ground potential) at the four nodes N1 to N4 are maintained so as to satisfy V1:V2:V3: V4=1:2:3:4. These voltages V1 to V4 correspond to the plurality of second voltages, which have a plurality of respective discrete voltage levels.

The capacitor C11 has two electrodes. One of the two electrodes of the capacitor C11 is connected to one end of the switch S11 and one end of the switch S12. The other one of the two electrodes of the capacitor C11 is connected to one end of the switch S21 and one end of the switch S22. For purposes of this disclosure the term "one end" may generally be considered a "first end" and the term "another end" or the "other end" may generally be considered a "second end".

The capacitor C12 is an example of a first capacitor and has two electrodes (an example of a first electrode and a second electrode). One of the two electrodes of the capacitor C12 is connected to the one end of the switch S21 and the one end of the switch S22. The other one of the two electrodes of the capacitor C12 is connected to one end of the switch S31 and one end of the switch S32.

The capacitor C13 has two electrodes. One of the two electrodes of the capacitor C13 is connected to the one end of the switch S31 and the one end of the switch S32. The other one of the two electrodes of the capacitor C13 is connected to one end of the switch S41 and one end of the switch S42.

The capacitor C14 has two electrodes. One of the two electrodes of the capacitor C14 is connected to one end of the switch S13 and one end of the switch S14. The other one of the two electrodes of the capacitor C14 is connected to one end of the switch S23 and one end of the switch S24.

The capacitor C15 is an example of a second capacitor and has two electrodes (an example of a third electrode and a fourth electrode). One of the two electrodes of the capacitor C15 is connected to the one end of the switch S23 and the one end of the switch S24. The other one of the two electrodes of the capacitor C15 is connected to one end of the switch S33 and one end of the switch S34.

The capacitor C16 has two electrodes. One of the two electrodes of the capacitor C16 is connected to the one end of the switch S33 and the one end of the switch S34. The other one of the two electrodes of the capacitor C16 is connected to one end of the switch S43 and one end of the switch S44.

A set of the capacitors C11 and C14, a set of the capacitors C12 and C15, a set of the capacitors C13 and C16 can each be complementarily charged and discharged by repeating a first phase and a second phase.

Specifically, in the first phase, the switches S12, S13, S22, S23, S32, S33, S42, and S43 are turned on. As a result, for example, the one of the two electrodes of the capacitor C12 is connected to the node N3, the other one of the two electrodes of the capacitor C12 and the one of the two electrodes of the capacitor C15 are connected to the node N2, and the other one of the two electrodes of the capacitor C15 is connected to the node N1.

In contrast, in the second phase, the switches S11, S14, S21, S24, S31, S34, S41, and S44 are turned on. As a result, for example, the one of the two electrodes of the capacitor C15 is connected to the node N3, the other one of the two electrodes of the capacitor C15 and the one of the two electrodes of the capacitor C12 are connected to the node N2, and the other one of the two electrodes of the capacitor C12 is connected to the node N1.

By repeating the first phase and the second phase, for example, when one of the capacitors C12 and C15 is charged from the node N2, the other one of the capacitors C12 and C15 can be discharged to the capacitor C30. That is, the capacitors C12 and C15 can complementarily be charged and discharged.

Similarly to the set of the capacitors C12 and C15, the set of the capacitors C11 and C14 and the set of the capacitors C13 and C16 can also be complementarily charged and discharged by repeating the first phase and the second phase.

Each of the capacitors C10, C20, C30, and C40 functions as a smoothing capacitor. That is, each of the capacitors C10, C20, C30, and C40 is configured to hold and smooth the voltages V1 to V4 at the nodes N1 to N4.

The capacitor C10 is connected between the node N1 and ground. Specifically, one of two electrodes of the capacitor C10 is connected to the node N1. In contrast, the other one of the two electrodes of the capacitor C10 is connected to ground.

The capacitor C20 is connected between the nodes N2 and N1. Specifically, one of two electrodes of the capacitor C20 is connected to the node N2. In contrast, the other one of the two electrodes of the capacitor C20 is connected to the node N1.

The capacitor C30 is connected between the nodes N3 and N2. Specifically, one of two electrodes of the capacitor C30 is connected to the node N3. In contrast, the other one of the two electrodes of the capacitor C30 is connected to the node N2.

The capacitor C40 is connected between the nodes N4 and N3. Specifically, one of two electrodes of the capacitor C40 is connected to the node N4. In contrast, the other one of the two electrodes of the capacitor C40 is connected to the node N3.

The switch S11 is connected between the one of the two electrodes of the capacitor C11 and the node N3. Specifically, the one end of the switch S11 is connected to the one of the two electrodes of the capacitor C11. In contrast, the other end of the switch S11 is connected to the node N3.

The switch S12 is connected between the one of the two electrodes of the capacitor C11 and the node N4. Specifically, the one end of the switch S12 is connected to the one of the two electrodes of the capacitor C11. In contrast, the other end of the switch S12 is connected to the node N4.

The switch S21 is an example of a first switch and is connected between the one of the two electrodes of the capacitor C12 and the node N2. Specifically, the one end of the switch S21 is connected to the one of the two electrodes of the capacitor C12 and the other one of the two electrodes of the capacitor C11. In contrast, the other end of the switch S21 is connected to the node N2.

The switch S22 is an example of a third switch and is connected between the one of the two electrodes of the capacitor C12 and the node N3. Specifically, the one end of the switch S22 is connected to the one of the two electrodes of the capacitor C12 and the other one of the two electrodes of the capacitor C11. In contrast, the other end of the switch S22 is connected to the node N3.

The switch S31 is an example of a fourth switch and is connected between the other one of the two electrodes of the capacitor C12 and the node N1. Specifically, the one end of the switch S31 is connected to the other one of the two electrodes of the capacitor C12 and the one of the two electrodes of the capacitor C13. In contrast, the other end of the switch S31 is connected to the node N1.

The switch S32 is an example of a second switch and is connected between the other one of the two electrodes of the capacitor C12 and the node N2. Specifically, the one end of the switch S32 is connected to the other one of the two electrodes of the capacitor C12 and the one of the two electrodes of the capacitor C13. In contrast, the other end of the switch S32 is connected to the node N2. That is, the other end of the switch S32 is connected to the other end of the switch S21.

The switch S41 is connected between the other one of the two electrodes of the capacitor C13 and ground. Specifically, the one end of the switch S41 is connected to the other one of the two electrodes of the capacitor C13. In contrast, the other end of the switch S41 is connected to ground.

The switch S42 is connected between the other one of the two electrodes of the capacitor C13 and the node N1. Specifically, the one end of the switch S42 is connected to the other one of the two electrodes of the capacitor C13. In contrast, the other end of the switch S42 is connected to the node N1. That is, the other end of the switch S42 is connected to the other end of the switch S31.

The switch S13 is connected between the one of the two electrodes of the capacitor C14 and the node N3. Specifically, the one end of the switch S13 is connected to the one of the two electrodes of the capacitor C14. In contrast, the other end of the switch S13 is connected to the node N3. That is, the other end of the switch S13 is connected to the other end of the switch S11 and the other end of the switch S22.

The switch S14 is connected between the one of the two electrodes of the capacitor C14 and the node N4. Specifically, the one end of the switch S14 is connected to the one of the two electrodes of the capacitor C14. In contrast, the other end of the switch S14 is connected to the node N4. That is, the other end of the switch S14 is connected to the other end of the switch S12.

The switch S23 is an example of a fifth switch and is connected between the one of the two electrodes of the capacitor C15 and the node N2. Specifically, the one end of the switch S23 is connected to the one of the two electrodes of the capacitor C15 and the other one of the two electrodes of the capacitor C14. In contrast, the other end of the switch S23 is connected to the node N2. That is, the other end of the switch S23 is connected to the other end of the switch S21 and the other end of the switch S32.

The switch S24 is an example of a seventh switch and is connected between the one of the two electrodes of the capacitor C15 and the node N3. Specifically, the one end of the switch S24 is connected to the one of the two electrodes of the capacitor C15 and the other one of the two electrodes of the capacitor C14. In contrast, the other end of the switch S24 is connected to the node N3. That is, the other end of the switch S24 is connected to the other end of the switch S11, the other end of the switch S22, and the other end of the switch S13.

The switch S33 is an example of an eighth switch and is connected between the other one of the two electrodes of the capacitor C15 and the node N1. Specifically, the one end of the switch S33 is connected to the other one of the two electrodes of the capacitor C15 and the one of the two electrodes of the capacitor C16. In contrast, the other end of the switch S33 is connected to the node N1. That is, the other end of the switch S33 is connected to the other end of the switch S31 and the other end of the switch S42.

The switch S34 is an example of a sixth switch and is connected between the other one of the two electrodes of the capacitor C15 and the node N2. Specifically, the one end of the switch S34 is connected to the other one of the two electrodes of the capacitor C15 and the one of the two electrodes of the capacitor C16. In contrast, the other end of the switch S34 is connected to the node N2. That is, the other end of the switch S34 is connected to the other end of the switch S21, the other end of the switch S32, and the other end of the switch S23.

The switch S43 is connected between the other one of the two electrodes of the capacitor C16 and ground. Specifically, the one end of the switch S43 is connected to the other one of the two electrodes of the capacitor C16. In contrast, the other end of the switch S43 is connected to ground.

The switch S44 is connected between the other one of the two electrodes of the capacitor C16 and the node N1. Specifically, the one end of the switch S44 is connected to the other one of the two electrodes of the capacitor C16. In contrast, the other end of the switch S44 is connected to the node N1. That is, the other end of the switch S44 is connected to the other end of the switch S31, the other end of the switch S42, and the other end of the switch S33.

A first set of switches including the switches S12, S13, S22, S23, S32, S33, S42, and S43 and a second set of switches including the switches S11, S14, S21, S24, S31, S34, S41, and S44 are turned on and off complementarily. Specifically, in the first phase, the first set of switches is turned on, and the second set of switches is turned off. In contrast, in the second phase, the first set of switches is turned off, and the second set of switches is turned on.

For example, charging from the capacitors C11 to C13 to the capacitors C10 to C40 is performed in one of the first phase and the second phase, and charging from the capacitors C14 to C16 to the capacitors C10 to C40 is performed in the other one of the first phase and the second phase. That is, the capacitors C10 to C40 are always charged from the capacitors C11 to C13 or the capacitors C14 to C16. Thus, even when current flows at high speed from the nodes N1 to N4 to the supply modulator 30, the nodes N1 to N4 are replenished with electric charge at high speed, so that the potential fluctuations of the nodes N1 to N4 can be suppressed.

By operating in this manner, the switched-capacitor circuit 20 can maintain approximately equal voltages at both ends of each of the capacitors C10, C20, C30, and C40. Specifically, the voltages V1 to V4 (voltages relative to the ground potential) that satisfy V1:V2:V3:V4=1:2:3:4 are maintained at the four nodes labeled V1 to V4. The voltage levels of the voltages V1 to V4 correspond to the plurality of discrete voltage levels that can be supplied by the switched-capacitor circuit 20 to the supply modulators 30A and 30B.

According to some exemplary aspects, the voltage ratio V1:V2:V3:V4 is not limited to 1:2:3:4. For example, the voltage ratio V1:V2:V3:V4 is 1:2:4:8 according to an exemplary aspect.

Moreover, the configuration of the switched-capacitor circuit 20 illustrated in FIG. 2 is an example and is not limited to this. In FIG. 2, the switched-capacitor circuit 20 is configured to be capable of supplying four discrete voltage levels of voltage, but it is not limited to this. According to an exemplary aspect, the switched-capacitor circuit 20 is configured to be capable of supplying a certain number of discrete voltage levels of voltage, the certain number being greater than or equal to two. For example, in a case where two discrete voltage levels of voltage are to be supplied, it is sufficient that the switched-capacitor circuit 20 include at least the capacitors C12 and C15 and the switches S21 to S24 and S31 to S34.

[1.2.2 Circuit Configuration of Supply Modulators 30A and 30B]

Next, the circuit configuration of the supply modulators 30A and 30B will be described. As illustrated in FIG. 2, the supply modulator 30A includes input terminals 131A to 134A, switches S51A to S54A, an output terminal 130A, and control terminals 135A and 136A. The supply modulator 30B includes input terminals 131B to 134B, switches S51B to S54B, an output terminal 130B, and control terminals 135B and 136B. In the following, the supply modulator 30A will be described, and description of the supply modulator 30B is omitted since the description is identical to that of the supply modulator 30A in which the sign "A" is replaced with "B". According to some exemplary aspects, the supply modulator 30B is integrated into the supply modulator 30A.

The output terminal 130A is connected to the filter circuit 40A. The output terminal 130A is a terminal for supplying the filter circuit 40A with a voltage selected from among the voltages V1 to V4.

The input terminals 131A to 134A are connected to the nodes N4 to N1 of the switched-capacitor circuit 20, respectively. The input terminals 131A to 134A are terminals for receiving the voltages V4 to V1 from the switched-capacitor circuit 20.

The control terminals 135A and 136A are input terminals for digital control signals. That is, the control terminals 135A and 136A are terminals for receiving digital control signals that indicate one out of the voltages V1 to V4. The supply modulator 30A controls on/off of the switches S51A to S54A so as to select the voltage level indicated by the digital control signals.

Two digital control logic (DCL: Digital Control Logic/ Line) signals can be used as the digital control signals received through the control terminals 135A and 136A. Each of the two DCL signals is a 1-bit signal. Each of the voltages V1 to V4 is expressed by a combination of two 1-bit signals. For example, V1, V2, V3, and V4 are expressed as "00", "01", "10", and "11", respectively. Gray codes are configured to express the voltage levels in some exemplary embodiments.

Note that two DCL signals are used in the present embodiment, but the number of DCL signals is not limited to this. For example, a certain number of DCL signals are used in accordance with the number of voltage levels, the certain number being greater than or equal to three. Moreover, the digital control signals are not limited to DCL signals and may also be control signals for a source synchronization method.

The switch S51A is connected between the input terminal 131A and the output terminal 130A. Specifically, the switch S51A has a terminal connected to the input terminal 131A and a terminal connected to the output terminal 130A. In this connection configuration, the switch S51A can switch connection and disconnection between the input terminal 131A and the output terminal 130A by switching on and off.

The switch S52A is an example of a tenth switch and is connected between the input terminal 132A and the output terminal 130A. Specifically, the switch S52A has a terminal connected to the input terminal 132A and a terminal connected to the output terminal 130A. In this connection configuration, the switch S52A can switch connection and disconnection between the input terminal 132A and the output terminal 130A by switching on and off.

The switch S53A is an example of a ninth switch and is connected between the input terminal 133A and the output terminal 130A. Specifically, the switch S53A has a terminal connected to the input terminal 133A and a terminal connected to the output terminal 130A. In this connection configuration, the switch S53A can switch connection and disconnection between the input terminal 133A and the output terminal 130A by switching on and off.

The switch S54A is connected between the input terminal 134A and the output terminal 130A. Specifically, the switch S54A has a terminal connected to the input terminal 134A and a terminal connected to the output terminal 130A. In this connection configuration, the switch S54A can switch connection and disconnection between the input terminal 134A and the output terminal 130A by switching on and off.

These switches S51A to S54A are controlled to be ON exclusively. That is, only one of the switches S51A to S54A is turned on, and the rest of the switches S51A to S54A are turned off. As a result, the supply modulator 30A can output one voltage selected from among the voltages V1 to V4.

Note that the configuration of the supply modulator 30A illustrated in FIG. 2 is an example and is not limited to this. In particular, it is sufficient that the switches S51A to S54A select at least one out of the four input terminals 131A to 134A and the at least one selected input terminal be connected to the output terminal 130A, and any configuration can be used. For example, the supply modulator 30A may further include a switch connected between the switches S51A to S53A and the switch S54A and output terminal 130A. Moreover, for example, the supply modulator 30A may further include a switch connected between the switches S51A and S52A and the switches S53A and S54A and output terminal 130A.

Note that in a case where two discrete voltage levels of voltage are to be supplied from the switched-capacitor circuit 20, it is sufficient that the supply modulator 30A be provided with at least the switches S52A and S53A.

[1.2.3 Circuit Configuration of Pre-Regulator Circuit 10]

First, the configuration of the pre-regulator circuit 10 will be descried. As illustrated in FIG. 2, the pre-regulator circuit 10 includes an input terminal 110, output terminals 111 to 114, inductor connection terminals 115 and 116, a control terminal 117, switches S61 to S63, S71, and S72, a power inductor L71, and capacitors C61 to C64.

The input terminal 110 is an input terminal for DC voltage. That is, the input terminal 110 is a terminal for receiving an input voltage from the DC power source 50.

The output terminal 111 is an output terminal for the voltage V4. That is, the output terminal 111 is a terminal for supplying the voltage V4 to the switched-capacitor circuit 20. The output terminal 111 is connected to the node N4 of the switched-capacitor circuit 20.

The output terminal 112 is an output terminal for the voltage V3. That is, the output terminal 112 is a terminal for supplying the voltage V3 to the switched-capacitor circuit 20. The output terminal 112 is connected to the node N3 of the switched-capacitor circuit 20.

The output terminal 113 is an output terminal for the voltage V2. That is, the output terminal 113 is a terminal for supplying the voltage V2 to the switched-capacitor circuit 20. The output terminal 113 is connected to the node N2 of the switched-capacitor circuit 20.

The output terminal 114 is an output terminal for the voltage V1. That is, the output terminal 114 is a terminal for supplying the voltage V1 to the switched-capacitor circuit 20. The output terminal 114 is connected to the node N1 of the switched-capacitor circuit 20.

The inductor connection terminal 115 is connected to one end of the power inductor L71. The inductor connection terminal 116 is connected to the other end of the power inductor L71.

The control terminal 117 is an input terminal for a digital control signal. That is, the control terminal 117 is a terminal for receiving a digital control signal for controlling the pre-regulator circuit 10. As the digital control signal received through the control terminal 117, for example, a control signal for a source synchronization method for transmitting a data signal and a clock signal can be used; however, the digital control signal is not limited to this. For example, as the digital control signal, a control signal for a clock embedding method in which a clock is embedded in a data signal is used in some exemplary embodiments. In some exemplary embodiments, the control terminal 117 and the control terminal 120 are combined into one terminal.

The switch S71 is connected between the input terminal 110 and the one end of the power inductor L71. Specifically, the switch S71 has a terminal connected to the input terminal 110 and a terminal connected to the one end of the power inductor L71 with the inductor connection terminal 115 interposed therebetween. In this connection configuration, the switch S71 can switch connection and disconnection between the input terminal 110 and the one end of the power inductor L71 by switching on and off.

The switch S72 is connected between the one end of the power inductor L71 and ground. Specifically, the switch S72 has a terminal connected to the one end of the power inductor L71 with the inductor connection terminal 115 interposed therebetween and a terminal connected to ground. In this connection configuration, the switch S72 can switch connection and disconnection between the one end of the power inductor L71 and ground by switching on and off.

The switch S61 is connected between the other end of the power inductor L71 and the output terminal 111. Specifically, the switch S61 has a terminal connected to the other end of the power inductor L71 and a terminal connected to the output terminal 111. In this connection configuration, the switch S61 can switch connection and disconnection between the other end of the power inductor L71 and the output terminal 111 by switching on and off.

The switch S62 is connected between the other end of the power inductor L71 and the output terminal 112. Specifically, the switch S62 has a terminal connected to the other end of the power inductor L71 and a terminal connected to the output terminal 112. In this connection configuration, the switch S62 can switch connection and disconnection between the other end of the power inductor L71 and the output terminal 112 by switching on and off.

The switch S63 is connected between the other end of the power inductor L71 and the output terminal 113. Specifically, the switch S63 has a terminal connected to the other end of the power inductor L71 and a terminal connected to the output terminal 113. In this connection configuration, the switch S63 can switch connection and disconnection between the other end of the power inductor L71 and the output terminal 113 by switching on and off.

One of two electrodes of the capacitor C61 is connected to the switch S61 and the output terminal 111. The other one of the two electrodes of the capacitor C61 is connected to the switch S62, the output terminal 112, and one of two electrodes of the capacitor C62.

The one of the two electrodes of the capacitor C62 is connected to the switch S62, the output terminal 112, and the other one of the two electrodes of the capacitor C61. The other one of the two electrodes of the capacitor C62 is connected to a path that connects the switch S63, the output terminal 113, and one of two electrodes of the capacitor C63.

The one of the two electrodes of the capacitor C63 is connected to the switch S63, the output terminal 113, and the other one of the two electrodes of the capacitor C62. The other one of the two electrodes of the capacitor C63 is connected to the output terminal 114 and one of two electrodes of the capacitor C64.

The one of the two electrodes of the capacitor C64 is connected to the output terminal 114 and the other one of the two electrodes of the capacitor C63. The other one of the two electrodes of the capacitor C64 is connected to ground.

The switches S61 to S63 are controlled to be ON exclusively. That is, only one of the switches S61 to S63 is turned on, and the rest of the switches S61 to S63 are turned off. By turning on only one of the switches S61 to S63, the pre-regulator circuit 10 can change the voltage to be supplied to the switched-capacitor circuit 20 between the voltage levels of the voltages V2 to V4.

The pre-regulator circuit 10 configured in this manner can supply electric charge to the switched-capacitor circuit 20 via at least one out of the output terminals 111 to 113.

Note that in a case where the input voltage is converted into one first voltage, it is sufficient that the pre-regulator circuit 10 include at least the switches S71 and S72 and the power inductor L71.

[1.2.4 Circuit Configuration of Filter Circuits 40A and 40B]

Next, the circuit configuration of the filter circuits 40A and 40B will be described. The filter circuits 40A and 40B include, for example, a low pass filter (LPF). Specifically, as illustrated in FIG. 2, the filter circuit 40A includes inductors L51A to L53A, capacitors C51A and C52A, a resistor R51A, an input terminal 140A, and an output terminal 141A. The filter circuit 40B also includes an LPF and includes inductors L51B to L53B, capacitors C51B and C52B, a resistor R51B, an input terminal 140B, and an output terminal 141B. In the following, the filter circuit 40A will be described, and description of the filter circuit 40B is omitted since the description is identical to that of the filter circuit 40A in which the sign "A" is replaced with "B".

The input terminal 140A is an input terminal for the voltage selected by the supply modulator 30A. That is, the input terminal 140A is a terminal for receiving the voltage selected from among the plurality of voltages V1 to V4.

The output terminal 141A is an output terminal for the power supply voltage $V_{ET4}$. That is, the output terminal 141A is a terminal for supplying the power supply voltage $V_{ET4}$ to the power amplifier 2A.

The inductors L51A to L53A, the capacitors C51A and C52A, and the resistor R51A form a low pass filter (LPF). As a result, the filter circuit 40A can reduce the radio frequency (RF) component included in the power supply voltage. For example, in a case where a predetermined band is a frequency band for frequency division duplex (FDD), the filter circuit 40A is configured to reduce the frequency components of the gap between the uplink operating band and the downlink operating band of the predetermined band.

Note that the configuration of the filter circuit 40A illustrated in FIG. 2 is an example and is not limited to this. For example, the filter circuit 40A does not have to include the inductor L53A and the resistor R51A. For example, the filter circuit 40A may include an inductor connected to one of two electrodes of the capacitor C51A and may include an inductor connected to one of two electrodes of the capacitor C52A.

2 Description of Digital ET Mode

Figure 3A:
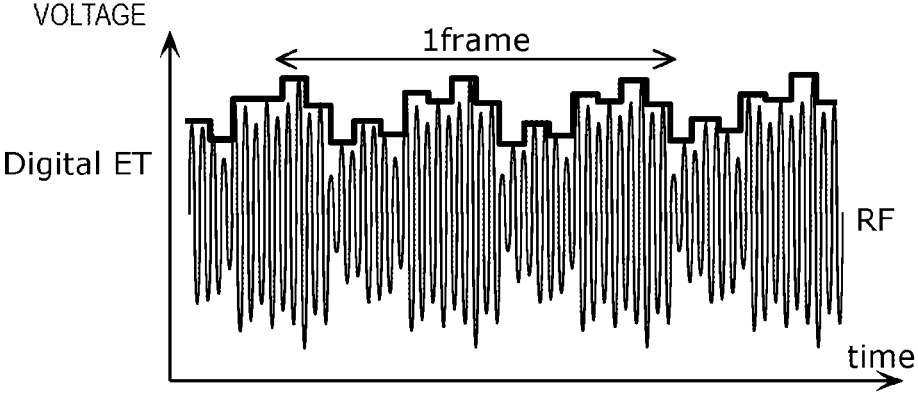
FIG. 3A is a graph illustrating power supply voltage supplied using digital envelope tracking.
Figure 3B:
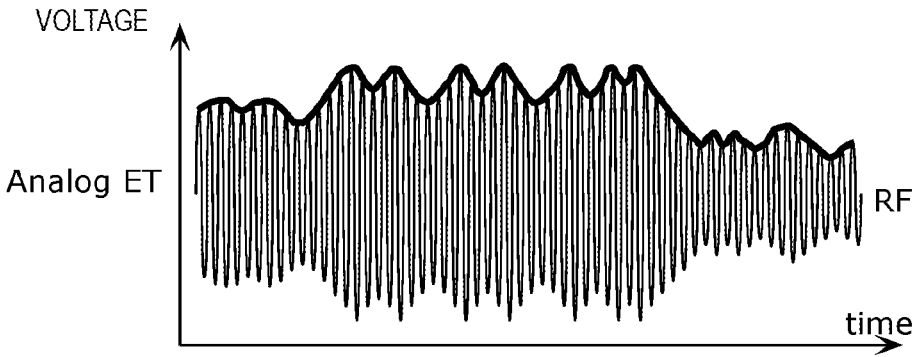
FIG. 3B is a graph illustrating power supply voltage supplied using analog envelope tracking.

In this case, the digital ET mode will be described with reference to FIGS. 3A and 3B while making comparisons with an existing ET mode (hereinafter referred to as an analog ET mode). FIG. 3A is a graph illustrating an example of transition of power supply voltage in the digital ET mode. FIG. 3B is a graph illustrating an example of transition of power supply voltage in the analog ET mode. In FIGS. 3A and 3B, the horizontal axis represents time, and the vertical axis represents voltage. Moreover, the thick solid lines represent power supply voltages, and the thin solid lines (waveforms) represent modulated signals.

In the digital ET mode, as illustrated in FIG. 3A, a modulated signal envelope is tracked by varying the power supply voltage to a plurality of discrete voltage levels within one frame. As a result, the signal of the power supply voltage forms a rectangular wave. In the digital ET mode, the level of the power supply voltage is selected or set from among the plurality of discrete voltage levels on the basis of the envelope signal.

According to the present disclosure, frames refer to units that form a radio frequency signal (e.g., a modulated signal). For example, in 5GNR and LTE, a frame includes 10 subframes, each subframe includes a plurality of slots, and each slot is composed of a plurality of symbols. The subframe length is 1 ms, and the frame length is 10 ms.

In the analog ET mode, as illustrated in FIG. 3B, a modulated signal envelope is tracked by continuously varying the power supply voltage. In the analog ET mode, the power supply voltage is determined on the basis of the envelope signal. Note that in the analog ET mode, in a case where the modulated signal envelope changes at high speed, it is difficult for the power supply voltage to track the envelope.

3 Component Arrangement of Tracker Module 100

Next, as an example of the power supply circuit 1 configured as described above, a tracker module 100 will be described with reference to FIGS. 4 to 6. In the tracker module 100, the pre-regulator circuit 10 (except for the power inductor L71), the switched-capacitor circuit 20, the supply modulators 30A and 30B, and the filter circuits 40A and 40B are mounted. Note that the power inductor L71 included in the pre-regulator circuit 10 does not have to be included in the tracker module 100, and illustration thereof is omitted.

Figure 4:
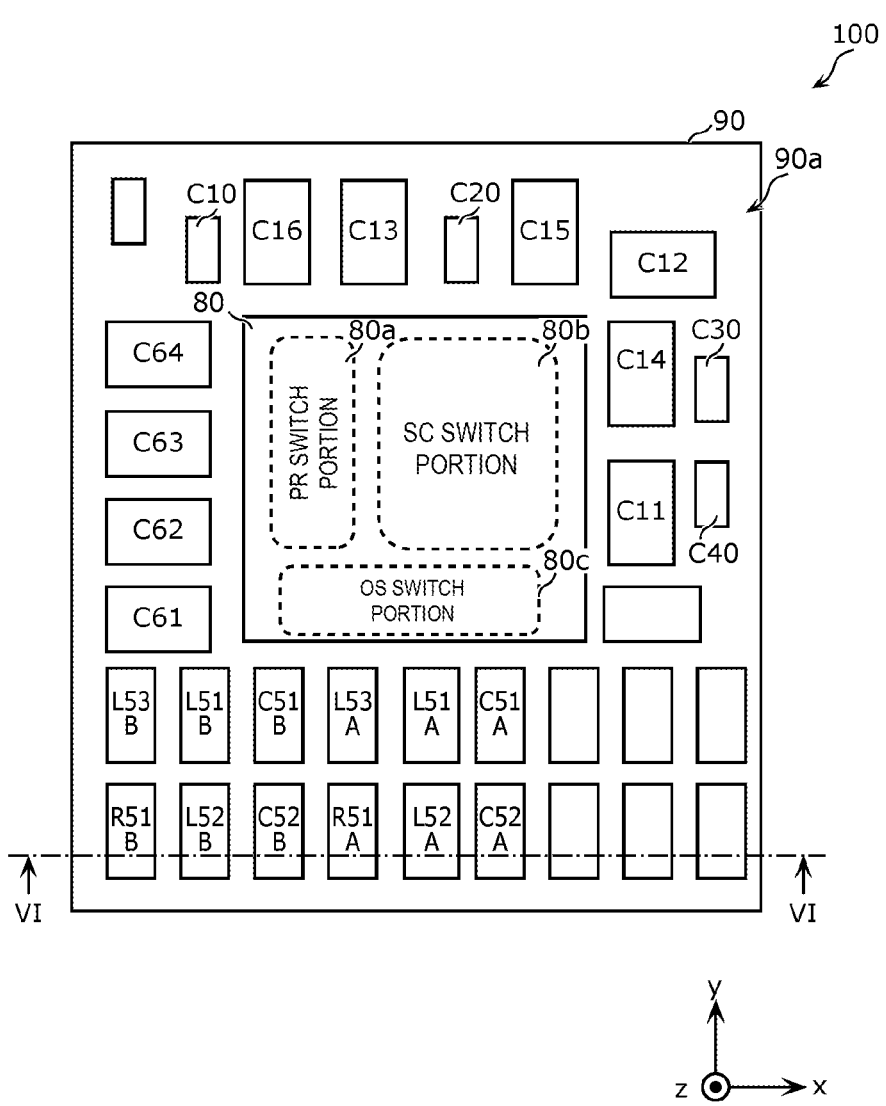
FIG. 4 is a plan view of a tracker module according to an example.

FIG. 4 is a plan view of the tracker module 100 according to the present example. FIG. 5 is a plan view of the tracker module 100 according to the present example and is a diagram of a main surface 90b side of a module laminate 90 in a see-through manner from the z-axis positive side. FIG. 6 is a cross-sectional view of the tracker module 100 according to the present example. The cross section of the tracker module 100 in FIG. 6 is a cross section taken along lines VI-VI of FIGS. 4 and 5.

Figure 5:
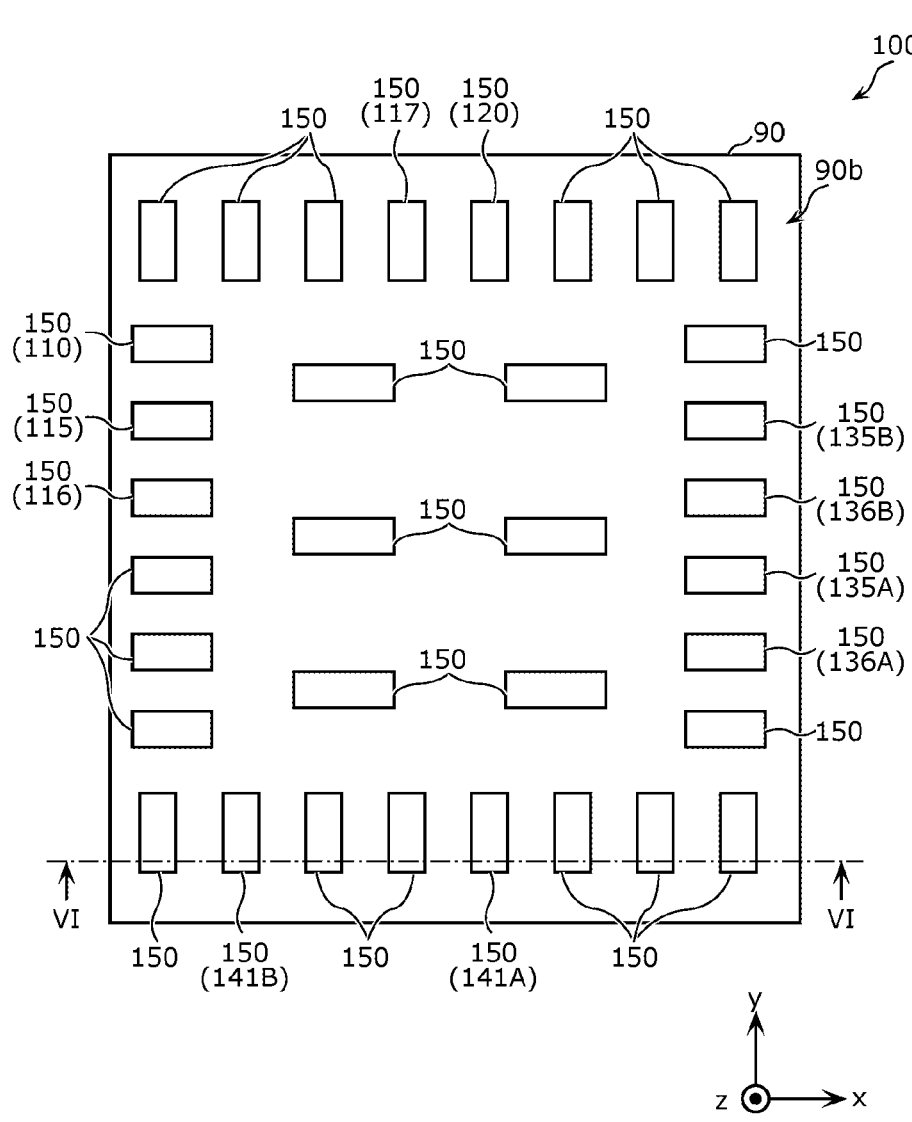
FIG. 5 is a plan view of the tracker module according to the example.
Figure 6:
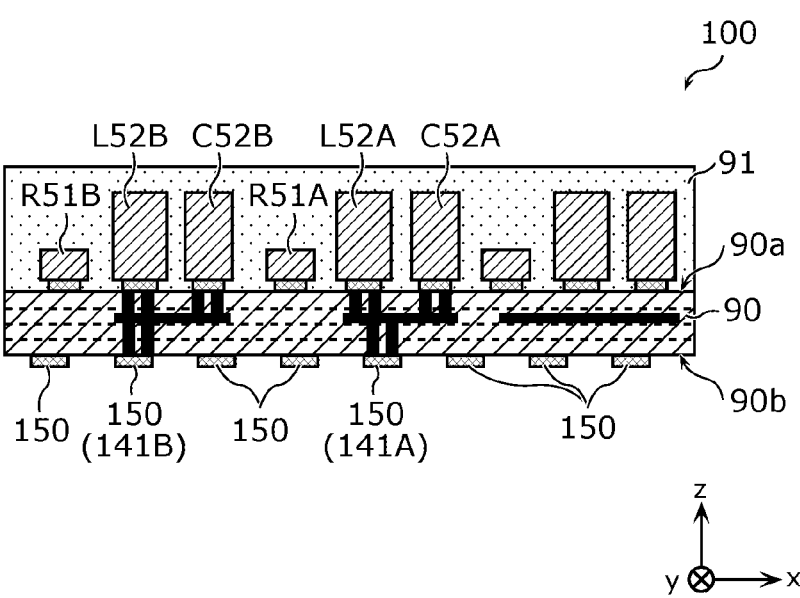
FIG. 6 is a cross-sectional view of the tracker module according to the example.

Note that in FIGS. 4 to 6, illustration of some of the wiring lines that connect a plurality of circuit components arranged in or on the module laminate 90 is omitted. In FIG. 4, illustration of a resin member 91 that covers a plurality of circuit components is omitted. In FIG. 4, blocks without signs represent any circuit components that are inessential to the present disclosure.

The tracker module 100 includes the module laminate 90, the resin member 91, and a plurality of land electrodes 150 in addition to a plurality of circuit components including active elements and passive elements (except for the power inductor L71) included in the pre-regulator circuit 10, the switched-capacitor circuit 20, the supply modulators 30A and 30B, and the filter circuits 40A and 40B illustrated in FIG. 2.

The module laminate 90 has main surfaces 90a and 90b facing each other. The main surfaces 90a and 90b are an example of a first main surface and a second main surface. In the module laminate 90, a wiring layer, via conductors, a ground plane, and so on are formed. Note that in FIGS. 4 and 5, the module laminate 90 has a rectangular shape in a plan view but is not limited to this shape.

As the module laminate 90, for example, a low temperature co-fired ceramics (LTCC) substrate or high temperature co-fired ceramics (HTCC) substrate having a multilayer structure formed by a plurality of dielectric layers, a component-embedded board, a substrate having a redistribution layer (RDL), a printed circuit board, or the like can be used; however, the module laminate 90 is not limited to these.

On the main surface 90a, an integrated circuit 80, the capacitors C10 to C16, C20, C30, C40, C51A, C51B, C52A, C52B, and C61 to C64, the inductors L51A to L53A and L51B to L53B, the resistors R51A and R51B, and the resin member 91 are arranged.

The integrated circuit 80 includes a PR switch portion 80a, an SC switch portion 80b, and an OS switch portion 80c. The PR switch portion 80a includes the switches S61 to S63, S71, and S72. The SC switch portion 80b is an example of a first switch portion and includes the switches S11 to S14, S21 to S24, S31 to S34, and S41 to S44. The OS switch portion 80c is an example of a second switch portion and includes the switches S51A to S54A and S51B to S54B.

Note that in FIG. 4, the PR switch portion 80a, the SC switch portion 80b, and the OS switch portion 80c are included in the integrated circuit 80, which is a single integrated circuit, but do not have to be included in a single integrated circuit. For example, the PR switch portion 80a and the SC switch portion 80b are included in a single integrated circuit, and the OS switch portion 80c is included in another integrated circuit. Moreover, for example, the SC switch portion 80b and the OS switch portion 80c are included in a single integrated circuit, and the PR switch portion 80a is included in another integrated circuit. The PR switch portion 80a and the OS switch portion 80c are included in a single integrated circuit, and the SC switch portion 80b is included in another integrated circuit. Moreover, for example, the PR switch portion 80a, the SC switch portion 80b, and the OS switch portion 80c are included individually in three integrated circuits.

In FIG. 4, the integrated circuit 80 has a rectangular shape in a plan view of the module laminate 90 but is not limited to this shape.

The integrated circuit 80 is composed of, for example, a complementary metal oxide semiconductor (CMOS) and is specifically manufactured using the Silicon on Insulator (SOI) process in some exemplary embodiments. Note that the integrated circuit 80 is not limited to a CMOS.

Each of the capacitors C10 to C16, C20, C30, C40, C51A, C52A, C51B, C52B, and C61 to C64 is mounted as a chip capacitor. A chip capacitor refers to a surface mount device (SMD) that is included in a capacitor. Note that the plurality of capacitors that are mounted are not limited to chip capacitors. For example, some or all of the plurality of capacitors are included in an integrated passive device (IPD) or are included in the integrated circuit 80 according to some exemplary aspects.

Each of the inductors L51A to L53A and L51B to L53B is mounted as a chip inductor. A chip inductor refers to an SMD that is included in an inductor. Note that the plurality of inductors that are mounted are not limited to chip inductors. For example, the plurality of inductors is included in an IPD according to an exemplary aspect.

Each of the resistors R51A and R51B is mounted as a chip resistor. A chip resistor refers to an SMD that is included in a resistor. Note that the resistors R51A and R51B that are mounted are not limited to chip resistors. For example, the resistors R51A and R51B are included in an IPD according to an exemplary aspect.

The plurality of capacitors, the plurality of inductors, and the plurality of resistors that are arranged on the main surface 90a in this manner are grouped by the type of circuit and are arranged around the integrated circuit 80.

Specifically, in the plan view of the module laminate 90, the group of the capacitors C61 to C64 included in the pre-regulator circuit 10 are arranged in a region on the main surface 90a sandwiched by a straight line along the left edge of the integrated circuit 80 and a straight line along the left edge of the module laminate 90. Consequently, the group of circuit components included in the pre-regulator circuit 10 is arranged close to the PR switch portion 80a in the integrated circuit 80.

In the plan view of the module laminate 90, the group of the capacitors C10 to C16, C20, C30, and C40 included in the switched-capacitor circuit 20 are arranged in a region on the main surface 90a sandwiched by a straight line along the upper edge of the integrated circuit 80 and a straight line along the upper edge of the module laminate 90 and a region on the main surface 90a sandwiched by a straight line along the right edge of the integrated circuit 80 and a straight line along the right edge of the module laminate 90. Consequently, the group of circuit components included in the switched-capacitor circuit 20 are arranged close to the SC switch portion 80b in the integrated circuit 80.

In the plan view of the module laminate 90, the group of the capacitors C51A, C51B, C52A, and C52B, the inductors L51A to L53A and L51B to L53B, and the resistors R51A and R51B included in the filter circuits 40A and 40B are arranged in a region on the main surface 90a sandwiched by a straight line along the lower edge of the integrated circuit 80 and a straight line along the lower edge of the module laminate 90. Consequently, the group of circuit components included in the filter circuits 40A and 40B are arranged close to the OS switch portion 80c in the integrated circuit 80. Conversely, the OS switch portion 80c is arranged closer to the filter circuits 40A and 40B than the PR switch portion 80a and the SC switch portion 80b are.

At least part of the filter circuit 40A and at least part of the filter circuit 40B are arranged adjacent to the same one of the four edges (the lower edge in FIG. 4) of the integrated circuit 80. Specifically, at least one of the circuit components included in the filter circuit 40A (the capacitor C51A and the inductors L51A and L53A in FIG. 4) are arranged adjacent to the lower edge of the integrated circuit 80. Furthermore, at least one of the circuit components included in the filter circuit 40B (the capacitor C51B in FIG. 4) is arranged adjacent to the lower edge of the integrated circuit 80.

On the main surface 90b, the plurality of land electrodes 150 are arranged. The plurality of land electrodes 150 function as a plurality of external connection terminals including a ground terminal in addition to the input terminal 110, the output terminals 141A and 141B, the inductor connection terminals 115 and 116, and the control terminals 117, 120, 135A, 135B, 136A, and 136B illustrated in FIG. 2. The plurality of land electrodes 150 are electrically connected to the plurality of electronic components arranged on the main surface 90a via, for example, the via conductors formed in the module laminate 90. As the plurality of land electrodes 150, copper electrodes can be used; however, the plurality of land electrodes 150 are not limited to these. For example, as the plurality of land electrodes, solder electrodes are used according to an exemplary aspect. Instead of the plurality of land electrodes 150, a plurality of bump electrodes or a plurality of post electrodes may also be used as a plurality of external connection terminals.

The land electrode 150 functioning as the output terminal 141A among the plurality of land electrodes 150 (the output terminal 141A) is an example of a first output terminal and overlaps at least part of the filter circuit 40A in a plan view of the module laminate 90. Specifically, the land electrode 150 (the output terminal 141A) overlaps the inductor L52A included in the filter circuit 40A in a plan view of the module laminate 90 (see FIG. 6).

The land electrode 150 functioning as the output terminal 141B among the plurality of land electrodes 150 (the output terminal 141B) is an example of a second output terminal and overlaps at least part of the filter circuit 40B in a plan view of the module laminate 90. Specifically, the land electrode 150 (the output terminal 141B) overlaps the inductor L52B included in the filter circuit 40B in a plan view of the module laminate 90 (see FIG. 6).

The resin member 91 covers the main surface 90a and at least part of the plurality of electronic components on the main surface 90a. The resin member 91 has the function of ensuring reliability such as mechanical strength and moisture resistance of the plurality of electronic components on the main surface 90a. Note that the resin member 91 does not have to be included in the tracker module 100.

Note that the configuration of the tracker module 100 according to the present example is an example and is not limited to this. For example, part of the capacitors and inductors arranged on the main surface 90a are formed in the module laminate 90 according to an exemplary aspect. Moreover, part of the capacitors and inductors arranged on the main surface 90a does not have to be included in the tracker module or arranged in or on the module laminate 90.

4 Effects and So On

As described above, the tracker module 100 according to the present example includes the module laminate 90, the integrated circuit 80 arranged in or on the module laminate 90, the filter circuit 40A arranged in or on the module laminate 90, and the output terminal 141A (the land electrode 150) electrically connected to the filter circuit 40A, and the integrated circuit 80 includes at least one switch included in the switched-capacitor circuit 20 and at least one switch included in the supply modulator 30A. The switched-capacitor circuit 20 is configured to generate a plurality of discrete voltages on the basis of the input voltage, and the supply modulator 30A is configured to output at least one out of the plurality of discrete voltages to the filter circuit 40A in a selective manner on the basis of a first envelope signal.

According to this configuration, the filter circuit 40A, to which at least one out of the plurality of discrete voltages is output from the supply modulator 30A, is arranged in or on the same module laminate 90 where the integrated circuit 80 is arranged. Thus, the noise component included in the voltage signal output from the supply modulator 30A can be attenuated in the tracker module 100, and the effect of noise generated in the module on elements outside the module can be reduced. In particular, unlike in the analog ET mode, the plurality of discrete voltage levels is switched over time in the digital ET mode, and thus the voltage signal output from the supply modulator 30A is a rectangular wave including a lot of radio frequency noise. Thus, the noise attenuation effect of arranging the filter circuit 40A not outside the tracker module 100 (for example, inside a radio frequency module) but inside the tracker module 100 is high.

In another aspect, the tracker module 100 according to the present example includes the module laminate 90, the integrated circuit 80 arranged in or on the module laminate 90, the filter circuit 40A arranged in or on the module laminate 90, and the land electrode 150 (the output terminal 141A) electrically connected to the filter circuit 40A. The integrated circuit 80 includes at least one switch included in the switched-capacitor circuit 20 and at least one switch included in the supply modulator 30A. The switched-capacitor circuit 20 includes the capacitor C12 and the capacitor C15. The capacitor C12 has two electrodes, and the capacitor C15 has two electrodes. The at least one switch included in the switched-capacitor circuit 20 includes the switches S21 to S24 and S31 to S34. The one end of the switch S21 and the one end of the switch S22 are connected to the one of the two electrodes of the capacitor C12. The one end of the switch S32 and the one end of the switch S31 are connected to the other one of the two electrodes of the capacitor C12. The one end of the switch S23 and the one end of the switch S24 are connected to the one of the two electrodes of the capacitor C15. The one end of the switch S34 and the one end of the switch S33 are connected to the other one of the two electrodes of the capacitor C15. The other end of the switch S21, the other end of the switch S32, the other end of the switch S23, and the other end of the switch S34 are connected to each other. The other end of the switch S22 is connected to the other end of the switch S24. The other end of the switch S31 is connected to the other end of the switch S33. The at least one switch included in the supply modulator 30A includes the switch S53A and the switch S52A. The switch S53A is connected between the other ends of the switches S21, S32, S23, and S34 and the filter circuit 40A. The switch S52A is connected between the other ends of the switches S22 and S24 and the filter circuit 40A.

According to this configuration, the filter circuit 40A connected between the supply modulator 30A and the land electrode 150 (the output terminal 141A) is arranged in or on the same module laminate 90 where the integrated circuit 80 is arranged. Thus, the noise component included in the voltage signal output from the supply modulator 30A can be attenuated in the tracker module 100, and the effect of noise generated in the module on elements outside the module can be reduced. In particular, unlike in the analog ET mode, the plurality of discrete voltage levels is switched over time in the digital ET mode, and thus the voltage signal output from the supply modulator 30A is a rectangular wave including a lot of radio frequency noise. According to some exemplary aspects, the noise attenuation effect of arranging the filter circuit 40A not outside the tracker module 100 (for example, inside a radio frequency module) but inside the tracker module 100 is high.

Moreover, for example, in the tracker module 100 according to the present example, at least part of the filter circuit 40A is arranged adjacent to the integrated circuit 80 according to an exemplary aspect.

According to this configuration, the wiring line length between the filter circuit 40A and the integrated circuit 80 can be shortened, and thus wiring loss can be reduced.

Moreover, for example, in the tracker module 100 according to the present example, the integrated circuit 80 may include the SC switch portion 80b and the OS switch portion 80c, the SC switch portion 80b including the at least one switch included in the switched-capacitor circuit 20, the OS switch portion 80c including the at least one switch included in the supply modulator 30A. The OS switch portion 80c is arranged closer to the filter circuit 40A than the SC switch portion 80b is according to an exemplary aspect.

According to this configuration, the wiring line length between the filter circuit 40A and the OS switch portion 80c in the integrated circuit 80 can be shortened, and thus wiring loss can be reduced.

Moreover, for example, in the tracker module 100 according to the present example, the module laminate 90 may have the main surfaces 90a and 90b facing each other. According to an exemplary aspect, the filter circuit 40A is arranged on the main surface 90a, the land electrode 150 (the output terminal 141A) is arranged on the main surface 90b, and at least part of the filter circuit 40A may overlap at least part of the land electrode 150 (the output terminal 141A) in a plan view of the module laminate 90.

According to this configuration, the wiring line length between the filter circuit 40A and the land electrode 150 (the output terminal 141A) can be shortened, and thus wiring loss can further be reduced.

Moreover, for example, in the tracker module 100 according to the present example, the filter circuit 40A may include an LPF.

According to this configuration, the harmonic wave components of radio frequency signals amplified by the power amplifier 2A can be attenuated, and the quality of transmission signals can be improved. Moreover, in a case where the communication device 7 includes a receive path, it is also possible to suppress a decrease in reception sensitivity.

Moreover, for example, the tracker module 100 according to the present example may further include the filter circuit 40B arranged in or on the module laminate 90, and the land electrode 150 (the output terminal 141B) electrically connected to the filter circuit 40B. According to an exemplary aspect, the supply modulator 30B is configured to output at least one out of the plurality of discrete voltages to the filter circuit 40B in a selective manner on the basis of a second envelope signal.

According to this configuration, the filter circuit 40B is also arranged in or on the module laminate 90 in addition to the filter circuit 40A. Thus, the noise component included in the voltage signal output from the supply modulator 30B can also be attenuated in the tracker module 100, and the effect of noise generated in the module on elements outside the module can be reduced.

Moreover, for example, in the tracker module 100 according to the present example, the integrated circuit 80 may have a plurality of edges that form the outline in a plan view of the module laminate 90, and at least part of the filter circuit 40A and at least part of the filter circuit 40B are arranged adjacent to the same edge among the plurality of edges according to an exemplary aspect.

According to this configuration, in addition to the wiring line length between the filter circuit 40A and the integrated circuit 80, the wiring line length between the filter circuit 40B and the integrated circuit 80 can also be shortened, and thus wiring loss can further be reduced.

Moreover, for example, in the tracker module 100 according to the present example, the integrated circuit 80 is a single integrated circuit according to an exemplary aspect.

According to this configuration, the switches included in the switched-capacitor circuit 20 and the supply modulator 30A can be integrated in the integrated circuit 80, which is a single integrated circuit, thereby contributing to the miniaturization of the tracker module 100.

ADDITIONAL EXEMPLARY EMBODIMENTS

The tracker modules according to the present disclosure have been described above on the basis of the embodiment and example. However, it is noted that the tracker modules according to the present disclosure are not limited to the above-described embodiment and example. The present disclosure also includes another embodiment and another example realized by combining any constituent elements of the above-described embodiment and example, variations obtained by applying various transformations to the above-described embodiment and example that are conceivable by those skilled in the art to the extent not departing from the gist of the present disclosure, and various devices incorporating the above-described tracker modules.

For example, in the circuit configuration of the various circuits according to the above-described embodiment, another circuit element, another wiring line, and so forth are inserted partway along the paths connecting each circuit element and each signal path disclosed in the drawings according to an exemplary aspect. For example, according to an exemplary aspect, an impedance matching circuit is inserted between the power amplifier 2A and the filter 3A, between the filter 3A and the antenna 6, or both between the power amplifier 2A and the filter 3A and between the filter 3A and the antenna 6.

Moreover, for example, in the tracker module 100 according to the present example, the capacitor C51A, the capacitor C52A, or the capacitors C51A and C52A are included in the integrated circuit 80 according to an exemplary aspect. Moreover, the capacitor C51B, the capacitor C52B, or the capacitors C51B and C52B are included in the integrated circuit 80 according to an exemplary aspect. This can contribute to the miniaturization of the tracker module 100.

As a tracker module that supplies a power supply voltage to a power amplifier, the present disclosure can be widely used for communication devices such as mobile phones.

Reference Signs List 1 power supply circuit
2A, 2B power amplifier
3A, 3B filter 4 PA control circuit
5 RFIC
6 antenna
7 communication device
10 pre-regulator circuit
20 switched-capacitor circuit
30A, 30B supply modulator
40A, 40B filter
50 direct current (DC) power source
80 integrated circuit
80a PR switch portion
80b SC switch portion
80c OS switch portion
90 module laminate
90a, 90b main surface
91 resin member
100 tracker module
110, 131A, 131B, 132A, 132B, 133A, 133B, 134A, 134B, 140A, 140B input terminal
111, 112, 113, 114, 130A, 130B, 141A, 141B output terminal
115, 116 inductor connection terminal
117, 120, 135A, 135B, 136A, 136B control terminal
150 land electrode
C10, C11, C12, C13, C14, C15, C16, C20, C30, C40, C51A, C51B, C52A, C52B, C61, C62, C63, C64 capacitor
L51A, L51B, L52A, L52B, L53A, L53B inductor
L71 power inductor
N1, N2, N3, N4 node
R51A, R51B resistor
S11, S12, S13, S14, S21, S22, S23, S24, S31, S32, S33, S34, S41, S42, S43, S44, S51A, S51B, S52A, S52B, S53A, S53B, S54A, S54B, S61, S62, S63, S71, S72 switch
V1, V2, V3, V4 voltage

The invention claimed is:

1. A tracker module comprising:

a module laminate;

at least one integrated circuit arranged in or on the module laminate, the at least one integrated circuit having a plurality of edges that form an outline in a plan view of the module laminate;

a first filter circuit arranged in or on the module laminate and configured to filter a first intermediate output and generate a first filtered output;

a second filter circuit arranged in or on the module laminate and configured to filter a second intermediate output and generate a second filtered output; and a first output terminal electrically coupled to the first filter circuit and configured to provide the first filtered output from the first filter circuit to a first external circuit that is outside of the tracker module, wherein the at least one integrated circuit includes:

at least one switch included in a switched-capacitor circuit that is configured to generate a plurality of discrete voltages; and at least one switch included in a supply modulator that is configured to generate the first intermediate output by selectively switching among the plurality of discrete voltages based on a first envelope signal to vary the first intermediate output with the first envelope signal, the first envelope signal being associated with a first signal to be processed by the first external circuit, wherein at least a part of the first filter circuit and at least a part of the second filter circuit are each arranged adjacent to a same edge of the plurality of edges of the at least one integrated circuit.

2. The tracker module according to claim 1, wherein at least a part of the first filter circuit is arranged adjacent to the at least one integrated circuit on the module laminate.

3. The tracker module according to claim 2, wherein the at least one integrated circuit includes:

first one or more switches that are a portion of the switched-capacitor circuit; and second one or more switches that are a portion of the supply modulator, and the second one or more switches are arranged closer in the plan view of the module laminate to the first filter circuit than the first one or more switches.

4. The tracker module according to claim 1, wherein:

the module laminate has a first main surface and a second main surface facing each other;

the first filter circuit is on the first main surface;

the first output terminal is on the second main surface; and in the plan view of the module laminate, at least a part of the first filter circuit overlaps with at least a part of the first output terminal.

5. The tracker module according to claim 1, wherein the first filter circuit includes a low pass filter.

6. The tracker module according to claim 5, wherein:

the low pass filter includes an inductor and a capacitor, and the capacitor is included in the at least one integrated circuit.

7. The tracker module according to claim 1, further comprising:

a second output terminal electrically connected to the second filter circuit and configured to provide the second filtered output from the second filter circuit to a second external circuit that is outside the tracker module, wherein the supply modulator is further configured to generate the second intermediate output by selectively switching among the plurality of discrete voltages based on a second envelope signal to vary the second intermediate output with the second envelope signal, the second envelope signal being associated with a second signal to be processed by the second external circuit.

8. The tracker module according to claim 1, wherein the at least one integrated circuit is a single integrated circuit.

9. A method performed by a tracker module, the method comprising:

generating a plurality of discrete voltages by a switched-capacitor circuit of the tracker module;

generating, by a supply modulator of the tracker module, a first intermediate output by selectively switching among the plurality of discrete voltages based on a first envelope signal to vary the first intermediate output with the first envelope signal, the first envelope signal being associated with a first signal to be processed by a first external circuit that is out of the tracker module;

filtering, by a first filter circuit of the tracker module, the first intermediate output to generate a first filtered output;

filtering, by a second filter circuit of the tracker module, a second intermediate output to generate a second filtered output; and outputting, by a first output terminal that is electrically coupled to the first filter circuit, the first filtered output to the first external circuit, the first filtered output providing power to the first external circuit, wherein the tracker module comprises at least one integrated circuit, the first filter circuit and the first output terminal that are arranged in or on a module laminate of the tracker module;

wherein the at least one integrated circuit includes first one or more switches that are a portion of the switched-capacitor circuit, and second one or more switches that are a portion of the supply modulator, wherein the at least one integrated circuit has a plurality of edges that form an outline in a plan view of the module laminate, and wherein at least a part of the first filter circuit and at least a part of the second filter circuit are each arranged adjacent to a same edge of the plurality of edges of the at least one integrated circuit.

10. The method according to claim 9, wherein at least a part of the first filter circuit is arranged adjacent to the at least one integrated circuit on the module laminate.

11. The method according to claim 10, wherein the second one or more switches are arranged closer in the plan view of the module laminate to the first filter circuit than the first one or more switches.

12. The method according to claim 9, wherein the first filter circuit and the first output terminal are arranged on opposite main surfaces of the module laminate and at least partially overlap in a plan view of the module laminate.

13. The method according to claim 9, wherein the filtering the first intermediate output further comprises filtering the first intermediate output by a low pass filter of the first filter circuit.

14. The method according to claim 13, wherein the filtering the first intermediate output further comprises filtering the first intermediate output by the low pass filter that includes an inductor and a capacitor.

15. The method according to claim 9, further comprising:

generating, by the supply modulator of the tracker module, the second intermediate output by selectively switching among the plurality of discrete voltages based on a second envelope signal to vary the second intermediate output with the second envelope signal, the second envelope signal being associated with a second signal to be processed by a second external circuit that is outside of the tracker module; and outputting, by a second output terminal that is electrically coupled to the second filter circuit, the second filtered output to the second external circuit, the second filtered output providing power to the second external circuit.

16. A tracker module, comprising:

a module laminate;

at least one integrated circuit arranged in or on the module laminate, the at least one integrated circuit having a plurality of edges that form an outline in a plan view of the module laminate;

a first filter circuit arranged in or on the module laminate and configured to filter a first intermediate output and generate a first filtered output;

a second filter circuit arranged in or on the module laminate and configured to filter a second intermediate output and generate a second filtered output; and a first output terminal electrically connected to the first filter circuit and configured to provide the first filtered output from the first filter circuit to a first external circuit that is outside of the tracker module, the first filtered output providing power to the first external circuit, wherein at least a part of the first filter circuit and at least a part of the second filter circuit are each arranged along a same edge of the plurality of edges of the at least one integrated circuit, and wherein:

the at least one integrated circuit includes:

at least one switch included in a switched-capacitor circuit; and at least one switch included in a supply modulator, the switched-capacitor circuit includes a first capacitor and a second capacitor, the first capacitor having a first electrode and a second electrode, the second capacitor having a third electrode and a fourth electrode, the at least one switch included in the switched-capacitor circuit includes a first switch, a second switch, a third switch, a fourth switch, a fifth switch, a sixth switch, a seventh switch, and an eighth switch, a first end of the first switch and a first end of the third switch are connected to the first electrode, a first end of the second switch and a first end of the fourth switch are connected to the second electrode, a first end of the fifth switch and a first end of the seventh switch are connected to the third electrode, a first end of the sixth switch and a first end of the eighth switch are connected to the fourth electrode, a second end of the first switch, a second end of the second switch, a second end of the fifth switch, and a second end of the sixth switch are connected together, a second end of the third switch is connected to a second end of the seventh switch, a second end of the fourth switch is connected to a second end of the eighth switch, and the at least one switch included in the supply modulator includes:

a ninth switch connected between the second ends of the first switch, the second switch, the fifth switch, and the sixth switch and the first filter circuit, and a tenth switch connected between the second ends of the third switch and the seventh switch and the first filter circuit.

17. The tracker module according to claim 16, wherein at least a part of the first filter circuit is arranged adjacent to the at least one integrated circuit.

18. The tracker module according to claim 17, wherein:

the at least one integrated circuit includes:

first one or more switches that are a portion of the switched-capacitor circuit; and second one or more switches that are a portion of the supply modulator, and the second one or more switches are arranged closer in the plan view of the module laminate to the first filter circuit than the first one or more switches.

19. The tracker module according to claim 16, wherein:

the module laminate has a first main surface and a second main surface facing each other, the first filter circuit is arranged on the first main surface, the first output terminal is arranged on the second main surface, and in the plan view of the module laminate, at least a part of the first filter circuit overlaps at least a part of the first output terminal.

20. The tracker module according to claim 1, wherein the at least a part of the first filter circuit and the at least a part of the second filter circuit are each arranged adjacent to the same edge of the plurality of edges of the at least one integrated circuit such that other circuit components are absent in a space between each of the first filter circuit and the second filter circuit and the edge of the at least one integrated circuit.

* * * * *